(12) United States Patent
Kim

(10) Patent No.: US 12,389,689 B2
(45) Date of Patent: Aug. 12, 2025

(54) BIDIRECTIONAL ELECTROSTATIC DISCHARGE PROTECTION DEVICE

(71) Applicant: DB HiTek Co., Ltd., Bucheon-si (KR)

(72) Inventor: Jong Min Kim, Seoul (KR)

( * ) Notice: Subject to any disclaimer, the term of this patent is extended or adjusted under 35 U.S.C. 154(b) by 483 days.

(21) Appl. No.: 18/157,072

(22) Filed: Jan. 20, 2023

(65) Prior Publication Data

US 2023/0352472 A1 Nov. 2, 2023

(30) Foreign Application Priority Data

Mar. 29, 2022 (KR) .................. 10-2022-0038501

(51) Int. Cl.
*H10D 89/60* (2025.01)
*H10D 10/60* (2025.01)

(52) U.S. Cl.
CPC ............ *H10D 89/60* (2025.01); *H10D 10/60* (2025.01); *H10D 89/711* (2025.01)

(58) Field of Classification Search
CPC .................................................. H10D 89/711
See application file for complete search history.

(56) References Cited

U.S. PATENT DOCUMENTS 10,276,557 B2    4/2019  Han et al.
2018/0082994 A1  3/2018  Han et al.

FOREIGN PATENT DOCUMENTS

KR    10-2018-0031175 A    3/2018

*Primary Examiner* — Amar Movva
(74) *Attorney, Agent, or Firm* — Central California IP Group, P.C.; Andrew D. Fortney

(57) ABSTRACT

Disclosed are bidirectional ESD protection devices capable of solving a breakdown voltage mismatch (BV mismatch) phenomenon while securing operation stability by providing a high breakdown voltage. The bidirectional ESD protection device includes an isolation region between an anode region and a cathode region, and the anode region and the cathode region may face each other with the isolation region in between. Accordingly, the bidirectional ESD protection device realizes high-voltage bidirectional characteristics without adding a mask, is minimized or reduced in size, and solves problems such as a breakdown voltage mismatch and instability.

20 Claims, 8 Drawing Sheets

BIDIRECTIONAL ELECTROSTATIC DISCHARGE PROTECTION DEVICE

CROSS REFERENCE TO RELATED APPLICATION

The present application claims priority to Korean Patent Application No. 10-2022-0038501, filed Mar. 29, 2022, the entire contents of which are incorporated herein for all purposes by this reference.

BACKGROUND OF THE INVENTION

Field of the Invention

The present disclosure concerns a bidirectional ESD protection device capable of solving a breakdown voltage mismatch (BV mismatch) phenomenon while securing operation stability (e.g., by having a high breakdown voltage). The present bidirectional ESD protection device includes an isolation region between an anode region and a cathode region, and the anode region and the cathode region face each other with the isolation region in between. Accordingly, the bidirectional ESD protection device realizes high-voltage bidirectional characteristics without adding a mask, is minimized or reduced in size, and solves problems such as a breakdown voltage mismatch and instability.

Description of the Related Art

In general, devices such as a silicon controlled rectifier (SCR), a double-diffused MOS (DMOS) transistor, and a bipolar junction transistor (BJT) are used as high-voltage electrostatic discharge (ESD) protection devices.

A conventional high-voltage bidirectional ESD protection device may be manufactured by connecting two ESD protection devices having a single high-voltage PNP structure in series (back to back series).

For example, referring to FIG. 1, a conventional high-voltage bidirectional ESD protection device floats an emitter and a base (an isolation ring has the role of the base) through interconnection between two devices.

In the conventional high-voltage bidirectional ESD protection device of FIG. 1, a reverse bias is applied to a junction between a P well (P-type well) and a base of a P-type substrate (P-sub) when a cathode is subjected to positive zapping (e.g., when an ESD event results in a high voltage on the cathode). Accordingly, in the conventional high-voltage bidirectional ESD protection device, a high positive voltage may be applied to the base and the cathode when the cathode is subjected to positive zapping.

In the conventional high-voltage bidirectional ESD protection device, a reverse bias is applied to a junction between a P well and a base of the cathode when the cathode is subjected to negative zapping (e.g., when an ESD event results in an unusually low negative voltage on the cathode). Accordingly, in the conventional high-voltage bidirectional ESD protection device, a high negative voltage may be applied to the cathode when the cathode is subjected to negative zapping.

Accordingly, the conventional high-voltage bidirectional ESD protection device operates bidirectionally with respect to an anode connected to a ground potential (GND).

However, the conventional high-voltage bidirectional ESD protection device has an isolation ring used as a base on both devices, so it is necessary to separate the two devices using the P-sub therebetween, resulting in a size/area increase.

The conventional high-voltage bidirectional ESD protection device has therein the P well of the cathode and a parasitic PNP structure between the base and the P-sub, so in order for the ESD device to operate stably, it is necessary to make a breakdown voltage (BV) (e.g., the collector-emitter breakdown voltage, or BVcex) of the parasitic PNP sufficiently greater than a breakdown voltage (e.g., BVcex) of an ESD PNP. Herein, BVcex refers to a breakdown voltage between a collector and an emitter while any bias (that is, generally, turn-on bias) is applied to a base.

In particular, the conventional high-voltage bidirectional ESD protection device operates under a forward condition in which the collector is higher than the base when the parasitic PNP in the direction of the cathode is subjected to positive zapping, or operates under a forward condition in which the P-sub is higher than the base when the parasitic PNP is subjected to negative zapping.

Therefore, in the conventional high-voltage bidirectional ESD protection device, the BVcex or threshold voltage (e.g., Vt1) of the parasitic PNP should be designed to be sufficiently larger than the corresponding Vt1 of the ESD PNP of the anode. Herein, Vt1 is a voltage (Vc) right before a resistance arises between an emitter and a collector in a bipolar junction transistor (BJT) because of snapback.

Fundamentally, the conventional high-voltage bidirectional ESD protection device should satisfy the above-described conditions in order to secure operation stability when the base of the ESD PNP shares the isolation ring. To this end, one should minimize the gain of the parasitic PNP and increase VT1 (SOA). Herein, VT1 (SOA) refers to a voltage current domain (that is, safe of area) that does not exceed Vt1 according to a base voltage (Vbase), wherein Vt1 varies with the base voltage.

The details described above are intended to help understanding of the background of the disclosure, and may include matters that are not publicly known or in the related art.

DOCUMENT OF RELATED ART

Korean Patent Application Publication No. 10-2018-0031175.

SUMMARY OF THE INVENTION

The present disclosure is to solve the problems in the related art described above.

The present disclosure is directed to providing a bidirectional ESD protection device capable of solving a breakdown voltage mismatch (BV mismatch) phenomenon while securing operation stability and providing a breakdown voltage (BV) of 60 V or greater in bipolar ESD device manufactured in a bipolar-CMOS-DMOS (BCD) process.

In addition, the present disclosure is directed to providing a bidirectional ESD protection device, in which a single bidirectional ESD protection device (e.g., a PNP type or an NPN type device) has a reduced area, a parasitic PNP including a base region in the device has an improved BVcex to secure stability of ESD operation characteristics, and the bidirectional ESD protection device reduces, minimizes or prevents a breakdown voltage variation (BV variation) and/or a left-right mismatch to secure a stable breakdown voltage.

The present disclosure may be implemented by one or more embodiments having one or more of the following configurations to achieve the above-described objectives.

According to one or more embodiments of the present disclosure, there is provided a bidirectional ESD protection device including a P-type epitaxial layer, an N-type buried layer in the epitaxial layer, a P well at or adjacent to an upper surface of the epitaxial layer (and optionally, close to a side of the epitaxial layer or the bidirectional ESD protection device); a plurality of N wells at or adjacent to the upper surface of the epitaxial layer and spaced apart from each other, a plurality of doped layers under the N wells, respectively, in the epitaxial layer; a plurality of connection N wells connected to the doped layers and the buried layer, in the epitaxial layer; a plurality of isolation P wells at or adjacent to the upper surface of the epitaxial layer and respectively between adjacent ones of the plurality of N wells; a plurality of isolation deep wells connected to the isolation P wells, respectively, in the epitaxial layer; and an anode region, a cathode region, and an isolation region between the anode region and the cathode region, wherein the isolation region comprises two adjacent ones of the plurality of N wells and the isolation P well between the two adjacent ones of the plurality of N wells, and the anode region and the cathode region comprise remaining ones of the plurality of N wells (other than the two adjacent ones of the N wells) and the remaining ones of the plurality of isolation P wells (other than the isolation P well in the isolation region) (e.g., on opposite sides of the isolation region).

According to another embodiment of the present disclosure, in the bidirectional ESD protection device, the plurality of N wells may include a first N well at or adjacent to the upper surface of the epitaxial layer and spaced apart from the P well; a second N well at or adjacent to the upper surface of the epitaxial layer and spaced apart from the first N well; a third N well at or adjacent to the upper surface of the epitaxial layer and spaced apart from the second N well; a fourth N well at or adjacent to the upper surface of the epitaxial layer and spaced apart from the third N well; a fifth N well at or adjacent to the upper surface of the epitaxial layer and spaced apart from the fourth N well; and a sixth N well at or adjacent to the upper surface of the epitaxial layer and spaced apart from the fifth N well.

According to still another embodiment of the present disclosure, in the bidirectional ESD protection device, the plurality of doped layers may include a first doped layer at least partially surrounding the first N well, in the epitaxial layer; a second doped layer at least partially surrounding the second N well, in the epitaxial layer; a third doped layer at least partially surrounding the third N well, in the epitaxial layer; a fourth doped layer at least partially surrounding the fourth N well, in the epitaxial layer; a fifth doped layer at least partially surrounding the fifth N well, in the epitaxial layer, and a sixth doped layer at least partially surrounding the sixth N well, in the epitaxial layer.

According to still another embodiment of the present disclosure, in the bidirectional ESD protection device, the plurality of connection N wells may include a first connection N well connecting the first doped layer with the buried layer, in the epitaxial layer; a second connection N well connecting the second doped layer with the buried layer, in the epitaxial layer; a third connection N well connecting the third doped layer with the buried layer, in the epitaxial layer; a fourth connection N well connecting the fourth doped layer with the buried layer, in the epitaxial layer; a fifth connection N well connecting the fifth doped layer with the buried layer, in the epitaxial layer, and a sixth connection N well connecting the sixth doped layer with the buried layer, in the epitaxial layer.

According to still another embodiment of the present disclosure, in the bidirectional ESD protection device, the plurality of isolation P wells may include a first isolation P well at or adjacent to the upper surface of the epitaxial layer, and between the first N well and the second N well; a second isolation P well at or adjacent to the upper surface of the epitaxial layer, and between the second N well and the third N well; a third isolation P well at or adjacent to the upper surface of the epitaxial layer, and between the third N well and the fourth N well; a fourth isolation P well at or adjacent to the upper surface of the epitaxial layer, and between the fourth N well and the fifth N well; and a fifth isolation P well at or adjacent to the upper surface of the epitaxial layer, and between the fifth N well and the sixth N well.

According to still another embodiment of the present disclosure, in the bidirectional ESD protection device, the plurality of isolation deep wells may include a first isolation deep well connected to the first isolation P well, in the epitaxial layer, a second isolation deep well connected to the second isolation P well, in the epitaxial layer; a third isolation deep well connected to the third isolation P well, in the epitaxial layer, a fourth isolation deep well connected to the fourth isolation P well, in the epitaxial layer; and a fifth isolation deep well connected to the fifth isolation P well, in the epitaxial layer.

According to still another embodiment of the present disclosure, in the bidirectional ESD protection device, the isolation region may comprise the third N well, the fourth N well, and the third isolation P well, the anode region may comprise the first N well, the second N well, the first isolation P well, and the second isolation P well (e.g., on one side of the isolation region), and the cathode region may comprise the fifth N well, the sixth N well, the fourth isolation P well, and the fifth isolation P well on an opposite side of the isolation region. The first N well, the second N well, the first isolation P well, and the second isolation P well may face the fifth N well, the sixth N well, the fourth isolation P well, and the fifth isolation P well, with the isolation region in the center.

According to still another embodiment of the present disclosure, there is provided a bidirectional ESD protection device including a P-type epitaxial layer, an N-type buried layer in the epitaxial layer, a P well at or adjacent to an upper surface of the epitaxial layer (and optionally, close to a side of the epitaxial layer or the bidirectional ESD protection device); a plurality of N wells at or adjacent to the upper surface of the epitaxial layer and spaced apart from each other; a plurality of doped layers under the N wells, respectively, in the epitaxial layer, a plurality of connection N wells connected to the doped layers and the buried layer, in the epitaxial layer; a plurality of isolation P wells at or adjacent to the upper surface of the epitaxial layer and respectively between adjacent ones of the plurality of N wells; and a plurality of isolation deep wells connected to the isolation P wells, respectively, in the epitaxial layer; and an anode region, a cathode region, and an isolation region between the anode region and the cathode region, wherein the isolation region comprises two adjacent ones of the plurality of N wells and the isolation P well between the two adjacent ones of the N wells. The anode region and the cathode region may face each other with the isolation region in a center, and the anode region and the cathode region may be on opposite sides of the isolation region.

According to still another embodiment of the present disclosure, in the bidirectional ESD protection device, the plurality of N wells may include a first N well at or adjacent to the upper surface of the epitaxial layer and spaced apart from the P well; a second N well at or adjacent to the upper surface of the epitaxial layer and spaced apart from the first N well; a third N well at or adjacent to the upper surface of the epitaxial layer and spaced apart from the second N well; a fourth N well at or adjacent to the upper surface of the epitaxial layer and spaced apart from the third N well; a fifth N well at or adjacent to the upper surface of the epitaxial layer and spaced apart from the fourth N well; and a sixth N well at or adjacent to the upper surface of the epitaxial layer and spaced apart from the fifth N well.

According to still another embodiment of the present disclosure, in the bidirectional ESD protection device, the plurality of doped layers may include a first doped layer at least partially surrounding the first N well, in the epitaxial layer; a second doped layer at least partially surrounding the second N well, in the epitaxial layer; a third doped layer at least partially surrounding the third N well, in the epitaxial layer; a fourth doped layer at least partially surrounding the fourth N well, in the epitaxial layer, a fifth doped layer at least partially surrounding the fifth N well, in the epitaxial layer, and a sixth doped layer at least partially surrounding the sixth N well, in the epitaxial layer.

According to still another embodiment of the present disclosure, in the bidirectional ESD protection device, the plurality of connection N wells may include a first connection N well under the first doped layer connecting the first doped layer with the buried layer, in the epitaxial layer; a second connection N well under the third doped layer connecting the third doped layer with the buried layer, in the epitaxial layer; a third connection N well under the fourth doped layer connecting the fourth doped layer with the buried layer, in the epitaxial layer; and a fourth connection N well under the sixth doped layer connecting the sixth doped layer with the buried layer, in the epitaxial layer.

According to still another embodiment of the present disclosure, in the bidirectional ESD protection device, the plurality of isolation P wells may include a first isolation P well at or adjacent to the upper surface of the epitaxial layer, and between the first N well and the second N well; a second isolation P well at or adjacent to the upper surface of the epitaxial layer, and between the second N well and the third N well; a third isolation P well at or adjacent to the upper surface of the epitaxial layer, and between the third N well and the fourth N well; a fourth isolation P well at or adjacent to the upper surface of the epitaxial layer, and between the fourth N well and the fifth N well; and a fifth isolation P well at or adjacent to the upper surface of the epitaxial layer, and between the fifth N well and the sixth N well.

According to still another embodiment of the present disclosure, in the bidirectional ESD protection device, the plurality of isolation deep wells may include a first isolation deep well connected to the first isolation P well, in the epitaxial layer, a second isolation deep well connected to the second isolation P well, in the epitaxial layer; a third isolation deep well connected to the third isolation P well, in the epitaxial layer, a fourth isolation deep well connected to the fourth isolation P well, in the epitaxial layer; and a fifth isolation deep well connected to the fifth isolation P well, in the epitaxial layer.

According to still another embodiment of the present disclosure, in the bidirectional ESD protection device, the isolation region may comprise the third N well, the fourth N well, and the third isolation P well, the anode region may comprise the first N well, the second N well, the first isolation P well, and the second isolation P well (e.g., on one side of the isolation region), and the fifth N well, the sixth N well, the fourth isolation P well, and the cathode region may comprise the fifth isolation P well (e.g., on an opposite side of the isolation region). The first N well, the second N well, the first isolation P well, and the second isolation P well may face the fifth N well, the sixth N well, the fourth isolation P well, and the fifth isolation P well, with the isolation region in the center.

According to still another embodiment of the present disclosure, there is provided a bidirectional ESD protection device including a P-type epitaxial layer, an N-type buried layer in the epitaxial layer, a P well at or adjacent to an upper surface of the epitaxial layer (and optionally, close to a side of the epitaxial layer or the bidirectional ESD protection device); a plurality of N wells at or adjacent to the upper surface of the epitaxial layer and spaced apart from each other; a plurality of doped layers under the N wells, respectively, in the epitaxial layer, a plurality of connection N wells connected to the doped layers and the buried layer, in the epitaxial layer; a plurality of isolation P wells at or adjacent to the upper surface of the epitaxial layer and respectively between each of the plurality of N wells; a plurality of isolation deep wells connected to the isolation P wells, respectively, in the epitaxial layer, and an anode region, a cathode region, and an isolation region between the anode region and the cathode region, wherein the isolation region comprises one of the plurality of N wells, and the anode region and the cathode region comprise remaining ones of the plurality of N wells (other than the N well in the isolation region) and the plurality of isolation P wells. The remaining ones of the plurality of N wells and the plurality of isolation P wells may face each other with the isolation region in the center, and the anode region and the cathode region may be on opposite sides of the isolation region.

According to still another embodiment of the present disclosure, in the bidirectional ESD protection device, the plurality of N wells may include a first N well at or adjacent to the upper surface of the epitaxial layer and spaced apart from the P well; a second N well at or adjacent to the upper surface of the epitaxial layer and spaced apart from the first N well; a third N well at or adjacent to the upper surface of the epitaxial layer and spaced apart from the second N well; a fourth N well at or adjacent to the upper surface of the epitaxial layer and spaced apart from the third N well; and a fifth N well at or adjacent to the upper surface of the epitaxial layer and spaced apart from the fourth N well, and the plurality of isolation P wells may include a first isolation P well at or adjacent to the upper surface of the epitaxial layer, and between the first N well and the second N well; a second isolation P well at or adjacent to the upper surface of the epitaxial layer, and between the second N well and the third N well; a third isolation P well at or adjacent to the upper surface of the epitaxial layer, and between the third N well and the fourth N well; and a fourth isolation P well at or adjacent to the upper surface of the epitaxial layer, and between the fourth N well and the fifth N well.

According to still another embodiment of the present disclosure, in the bidirectional ESD protection device, the plurality of doped layers may include a first doped layer at least partially surrounding the first N well, in the epitaxial layer; a second doped layer at least partially surrounding the second N well, in the epitaxial layer; a third doped layer at least partially surrounding the third N well, in the epitaxial layer; a fourth doped layer at least partially surrounding the fourth N well, in the epitaxial layer; and a fifth doped layer at least partially surrounding the fifth N well, in the epitaxial layer.

According to still another embodiment of the present disclosure, in the bidirectional ESD protection device, the plurality of connection N wells may include a first connection N well connecting the first doped layer with the buried layer, in the epitaxial layer; a second connection N well connecting the third doped layer with the buried layer, in the epitaxial layer; and a third connection N well connecting the fifth doped layer with the buried layer, in the epitaxial layer.

According to still another embodiment of the present disclosure, in the bidirectional ESD protection device, the plurality of isolation deep wells may include a first isolation deep well connected to the first isolation P well under the first isolation P well, in the epitaxial layer; a second isolation deep well connected to the second isolation P well under the second isolation P well, in the epitaxial layer, a third isolation deep well connected to the third isolation P well under the third isolation P well, in the epitaxial layer; and a fourth isolation deep well connected to the fourth isolation P well under the fourth isolation P well, in the epitaxial layer.

According to still another embodiment of the present disclosure, in the bidirectional ESD protection device, the isolation region may comprise the third N well between the anode region and the cathode region, the anode region may comprise the first N well, the second N well, the first isolation P well, and the second isolation P well on one side of the isolation region, and the cathode region may comprise the fourth N well, the fifth N well, the third isolation P well, and the fourth isolation P well on an opposite side of the isolation region. The first N well, the second N well, the first isolation P well, and the second isolation P well may face the fourth N well, the fifth N well, the third isolation P well, and the fourth isolation P well, with the isolation region in the center.

According to the above configurations, the present disclosure has the following effects.

According to the present disclosure, the bidirectional ESD protection device can realize high-voltage bidirectional characteristics without adding a mask.

In addition, since a mask is not added, the bidirectional ESD protection device can realize bidirectional characteristics and can be minimized or reduced in size.

In addition, the bidirectional ESD protection device can be designed to have the same breakdown voltage or an asymmetric breakdown voltage according to an operation condition by realizing a PNP structure in which the anode region and the cathode region face each other with the isolation region in between (e.g., are on opposite sides of the isolation region).

In addition, the bidirectional ESD protection device can solve the problem in the related art, an unstable breakdown voltage, by providing a high-voltage region with a stable breakdown voltage.

It is noted that, although not explicitly described under this section, an advantageous effect and a tentative advantageous effect that are expected from technical features of the present disclosure are regarded as being described in the specification of the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to the accompanying drawings. It is noted that the embodiments of the present disclosure may be changed to a variety of other or different embodiments. The scope of the present disclosure should not be interpreted as being limited to the embodiments described hereinbelow, but should be interpreted on the basis of the descriptions in the appended claims. In addition, the embodiments of the present disclosure are provided for reference in order to fully describe the disclosure for those skilled in the art.

Unless otherwise mentioned in context, a singular noun or a singular noun phrase may have a plural meaning through the present specification. The terms "comprise" and/or "comprising" that are used in the present specification are intended to indicate that a shape, a number, a step, an operation, a member, an element, and/or a group thereof is/are present, and therefore do not to preclude the presence or addition of one or more other shapes, numbers, steps, operations, members, elements, and/or groups thereof.

It should be noted that, in a case where one element (or layer) is described as being on another element (or layer), this means that the one element may be directly on the other element or that one or more third elements (or layers) may be therebetween. In addition, in the case where one element is described as being directly on the other element, no third element(s) is therebetween. In addition, positioning on a "top", "upper portion", or "lower portion" of one element, positioning "above" or "below" one element, or positioning on "one lateral side", or a "lateral surface" of one element means a relative positional relationship between the elements.

In the embodiments described below, a first conductivity type may be P-type, and a second conductivity type may be N-type, for example, but are not necessarily limited thereto.

Figure 1:
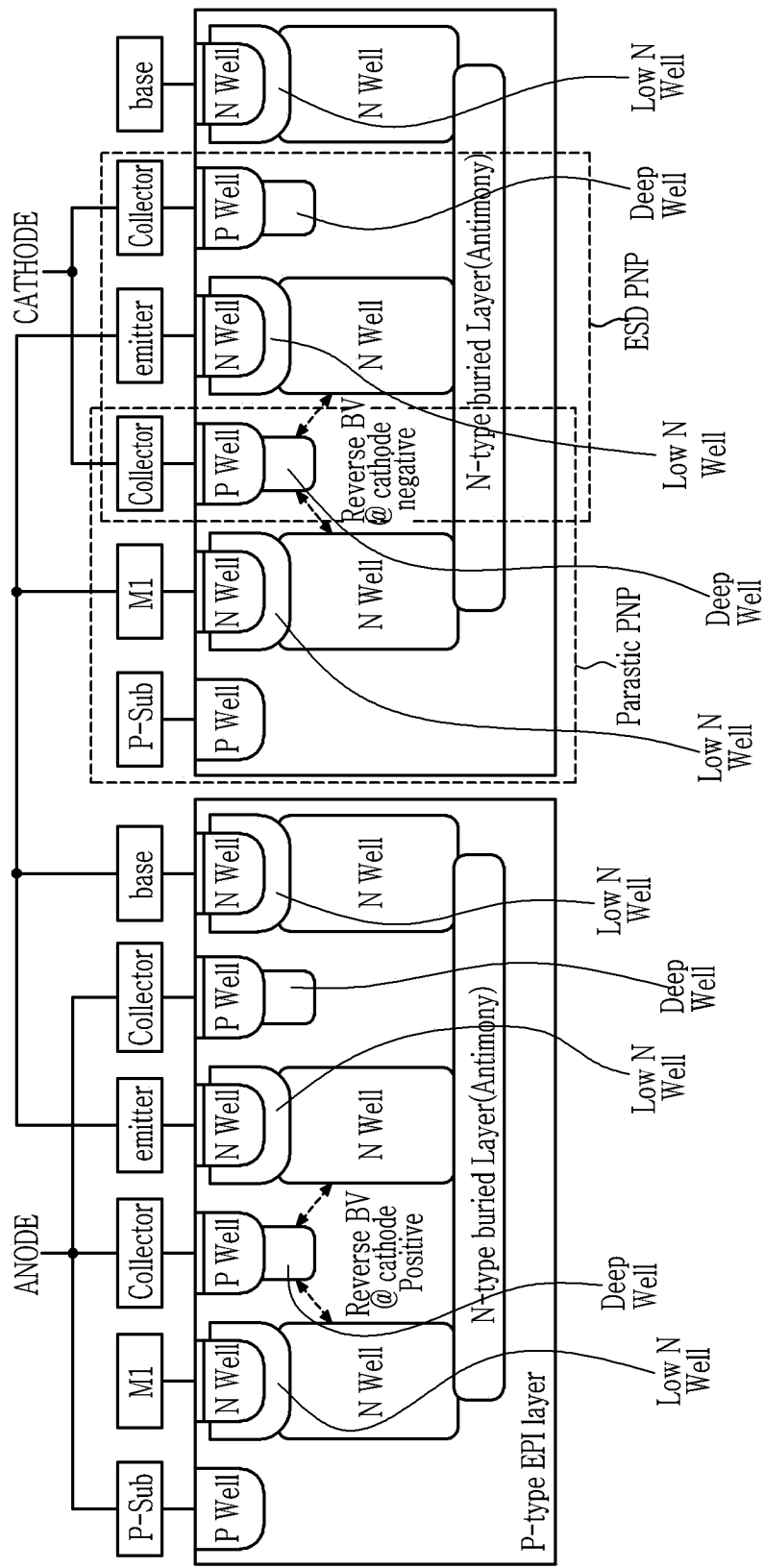
FIG. 1 is a diagram illustrating a conventional bidirectional ESD protection device.
Figure 2:
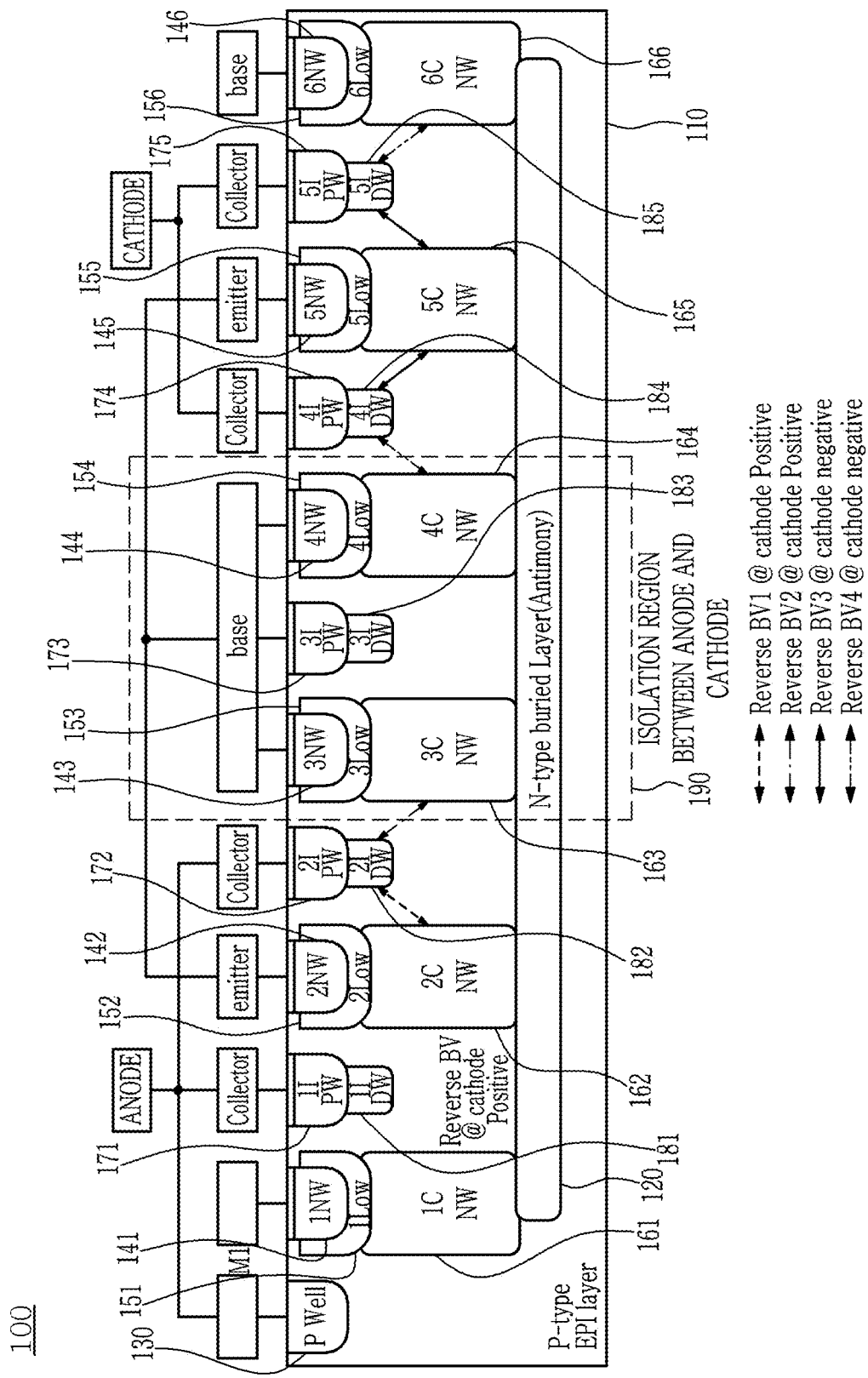
FIGS. 2 and 3 are diagrams illustrating a bidirectional ESD protection device according to a first exemplary embodiment of the present disclosure.
Figure 3:
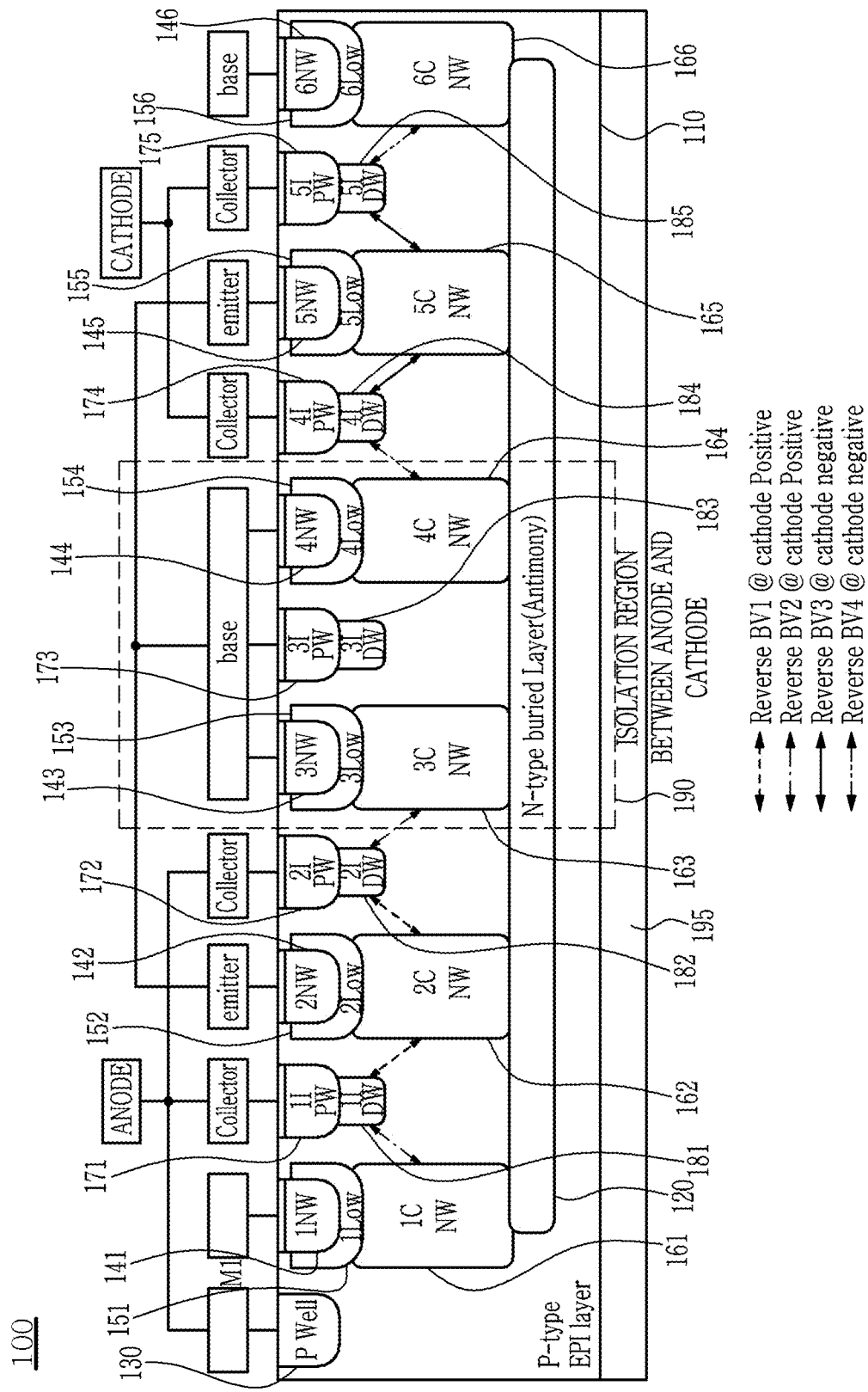

FIGS. 2 and 3 are diagrams illustrating a bidirectional ESD protection device according to a first exemplary embodiment of the present disclosure.

Hereinafter, a bidirectional ESD protection device according to embodiments of the present disclosure will be described in detail with reference to the accompanying drawings.

Referring to FIGS. 2 and 3, the bidirectional ESD protection device 100 according to the first exemplary embodiment of the present disclosure includes an epitaxial layer 110, a buried layer 120, a P well 130, a first N well 141, a second N well 142, a third N well 143, a fourth N well 144, a fifth N well 145, a sixth N well 146, a first doped layer 151, a second doped layer 152, a third doped layer 153, a fourth doped layer 154, a fifth doped layer 155, a sixth doped layer 156, a first connection N well 161, a second connection N well 162, a third connection N well 163, a fourth connection N well 164, a fifth connection N well 165, a sixth connection N well 166, a first isolation P well 171, a second isolation P well 172, a third isolation P well 173, a fourth isolation P well 174, a fifth isolation P well 175, a first isolation deep well 181, a second isolation deep well 182, a third isolation deep well 183, a fourth isolation deep well 184, and a fifth isolation deep well 185.

The epitaxial layer 110 is on one surface of a semiconductor substrate 195. The epitaxial layer 110 has the first conductivity type, and may comprise elemental silicon and be formed by an epitaxial growth process. For example, the epitaxial layer 110 may further comprise one or more dopants and be doped by adding the dopant(s) during the epitaxial growth process. The epitaxial layer may also be doped by ion implantation after the epitaxial layer is formed.

The buried layer 120 is in the epitaxial layer 110 and has a predetermined width. The buried layer 120 may be close to a lower surface of the epitaxial layer 110, inside the epitaxial layer 110. The buried layer 120 is connected to lower surfaces of the first connection N well 161 to the sixth connection N well 166. The buried layer 120 comprises antimony, a material of the second conductivity type, for example.

The P well 130 is in the epitaxial layer 110, at or adjacent to an upper surface of the epitaxial layer 110. The P well 130 may be at one outermost side or border of the device 100 (e.g., close to the left or right side of the epitaxial layer 110 in the drawing). The P well 130 may be formed by injecting high-concentration first-conductivity-type impurities into the surface of the epitaxial layer 110 through a photolithographically-patterned mask. The P well 130 is connected to (e.g., in ohmic contact with) a P-sub terminal and/or electrode.

The first N well 141 to the sixth N well 146 are in the epitaxial layer 110, at or adjacent to the upper surface of the epitaxial layer 110. The first N well 141 to the sixth N well 146 are between the right side of the epitaxial layer 110 and the P well 130 in the drawing, and spaced apart from each other by a predetermined distance.

The first N well 141 is adjacent to the P well 130 and connected to an M1 terminal and/or electrode. The second N well 142 is adjacent to the first N well 141 and connected to an emitter terminal and/or electrode. That is, a P+ region adjacent to the second N well 142 may be connected to the anode collector terminal and/or electrode, the second N well 142 is connected to the anode emitter terminal and/or electrode.

The third N well 143 is adjacent to the second N well 142 and connected to a base terminal and/or electrode.

The fourth N well 144 is adjacent to the third N well 143 and connected to the base terminal and/or electrode.

The fifth N well 145 is adjacent to the fourth N well 144 and connected to an emitter terminal and/or electrode. That is, a P+ region adjacent to the fifth N well 145 may be connected to the cathode collector terminal and/or electrode, the fifth N well 145 is connected to the cathode emitter terminal and/or electrode. The sixth N well 146 is at or adjacent to the fifth N well 145 and connected to a base terminal and/or electrode. Thus, the second N well 142 may be between the first N well 141 and the third N well 143, the third N well 143 may be between the second N well 142 and the fourth N well 144, the fourth N well 144 may be between the third N well 143 and the fifth N well 145, and the fifth N well 145 may be between the fourth N well 144 and the sixth N well 146.

The first doped layer 151 to the sixth doped layer 156 are in the epitaxial layer 110, and under the first N well 141 to the sixth N well 146.

The first doped layer 151 to the sixth doped layer 156 may overlap with parts of the first N well 141 to the sixth N well 146, respectively. That is, the first doped layer 151 is under the first N well 141, and may overlap with the first N well 141. The second doped layer 152 is under the second N well 142, and may overlap with the second N well 142. The third doped layer 153 is under the third N well 143, and may overlap with the third N well 143. The fourth doped layer 154 is under the fourth N well 144, and may overlap with the fourth N well 144. The fifth doped layer 155 is under the fifth N well 145, and may overlap with the fifth N well 145. The sixth doped layer 156 is under the sixth N well 146, and may overlap with the sixth N well 146.

The first connection N well 161 to the sixth connection N well 166 are in the epitaxial layer 110, and may be under the first doped layer 151 to the sixth doped layer 156, respectively.

The first connection N well 161 to the sixth connection N well 166 connect the buried layer 120 to the first doped layer 151 to the sixth doped layer 156 or lower surfaces thereof, respectively. That is, in the drawing, an upper portion of the first connection N well 161 is connected to the first doped layer 151, and a lower portion of the first connection N well 161 is connected to the buried layer 120. In the drawing, an upper portion of the second connection N well 162 is connected to the second doped layer 152, and a lower portion of the second connection N well 162 is connected to the buried layer 120. In the drawing, an upper portion of the third connection N well 163 is connected to the third doped layer 153, and a lower portion of the third connection N well 163 is connected to the buried layer 120. In the drawing, an upper portion of the fourth connection N well 164 is connected to the fourth doped layer 154, and a lower portion of the fourth connection N well 164 is connected to the buried layer 120. In the drawing, an upper portion of the fifth connection N well 165 is connected to the fifth doped layer 155, and a lower portion of the fifth connection N well 165 is connected to the buried layer 120. In the drawing, an upper portion of the sixth connection N well 166 is connected to the sixth doped layer 156, and a lower portion of the sixth connection N well 166 is connected to the buried layer 120.

The first isolation P well 171 to the fifth isolation P well 175 are in the epitaxial layer 110, and at or adjacent to the upper surface of the epitaxial layer 110. The first isolation P well 171 to the fifth isolation P well 175 are spaced apart from each other by a predetermined distance, and are respectively between adjacent ones of the N wells.

The first isolation P well 171 is between the first N well 141 and the second N well 142 and connected to a first (e.g., anode) collector terminal and/or electrode. The second isolation P well 172 is between the second N well 142 and the third N well 143 and connected to the first collector terminal and/or electrode. The third isolation P well 173 is between the third N well 143 and the fourth N well 144 and connected to the base terminal and/or electrode. The fourth isolation P well 174 is between the fourth N well 144 and the fifth N well 145 and connected to a second (e.g., cathode) collector terminal and/or electrode. The fifth isolation P well 175 is between the fifth N well 145 and the sixth N well 146 and connected to the second collector terminal and/or electrode.

The first isolation deep well 181 to the fifth isolation deep well 185 are in the epitaxial layer 110, and under the first isolation P well 171 to the fifth isolation P well 175. The first isolation deep well 181 is under the first isolation P well 171, and connected to a lower portion of the first isolation P well 171. The second isolation deep well 182 is under the second isolation P well 172, and connected to a lower portion of the second isolation P well 172. The third isolation deep well 183 is under the third isolation P well 173, and connected to a lower portion of the third isolation P well 173. The fourth isolation deep well 184 is under the fourth isolation P well 174, and connected to a lower portion of the fourth isolation P well 174. The fifth isolation deep well 185 is under the fifth isolation P well 175, and connected to a lower portion of the fifth isolation P well 175.

The third N well 143, the third isolation P well 173, and the fourth N well 144 connected to the base terminal and/or electrode in the center of the drawing constitute an isolation region 190. Herein, the isolation region 190 serves as a region for isolation between an anode on the left side of the drawing and a cathode on the right side of the drawing. The isolation region 190 includes the third doped layer 153 and the third connection N well 163 connected to the third N well 143, the third isolation deep well 183 connected to the third isolation P well 173, the fourth doped layer 154 and the fourth connection N well 164 connected to the fourth N well 144, and part of the buried layer 120.

Herein, the P-sub terminal and/or electrode and the collector terminals and/or electrodes on the left side of the drawing constitute the anode, and the collector terminals and/or electrodes on the right side of the drawing constitute the cathode. The device 100 may function as a type or kind of bidirectional diode, in which only voltages greater than a first positive threshold and voltages less than a second negative threshold pass through the device.

The P well 130, the first isolation P well 171, the first isolation deep well 181, the second isolation P well 172, and the second isolation deep well 182 constitute an anode region. Herein, the anode region may include the first N well 141, the first doped layer 151, the first connection N well 161, the second N well 142, the second doped layer 152, and the second connection N well 162.

The fourth isolation P well 174, the fourth isolation deep well 184, the fifth isolation P well 175, and the fifth isolation deep well 185 constitute a cathode region. Herein, the cathode region may include the fifth N well 145, the fifth doped layer 155, the fifth connection N well 165, the sixth N well 146, the sixth doped layer 156, and the sixth connection N well 166.

The isolation region 190 constitutes an isolation structure having a very large BVcex between the anode region and the cathode region. That is, the BVcex of the isolation region 190 has a value greater than the breakdown voltages (BV2 @ cathode positive and BV1 @ cathode positive) when the cathode is subjected to positive zapping. Herein, the breakdown voltage BV2 @ cathode positive has a value greater than the breakdown voltage BV1 @ cathode positive, and has the relation below. Herein, the BVcex is the breakdown voltage between the collector connected to the cathode and the collector connected to the anode while any bias (that is, generally, turn-on bias) is applied to the base (i.e., the isolation region between the anode and the cathode):

$BVcex > BV2$@cathode positive$\gg BV1$@cathode positive

In addition, the BVcex of the isolation region 190 has a value greater than breakdown voltages (BV3 @ cathode negative and BV4 @ cathode negative) when the cathode is subjected to negative zapping. Herein, the breakdown voltage BV4 @ cathode negative has a value greater than the breakdown voltage BV3 @ cathode negative, and has the relation below:

$BVcex > BV4$@Cathode Negative$\gg BV3$@Cathode Negative

In addition, the isolation P well 130 and the base (that is, a PNP device) in the anode region or the cathode region may comprise a multi-finger device or have a multi-finger layout.

Accordingly, the bidirectional ESD protection device 100 according to the first exemplary embodiment of the present disclosure can secure the same breakdown voltages (BVs) in positive zapping and negative zapping when the PNP transistors in the anode region and the cathode region are the same.

Figure 4:
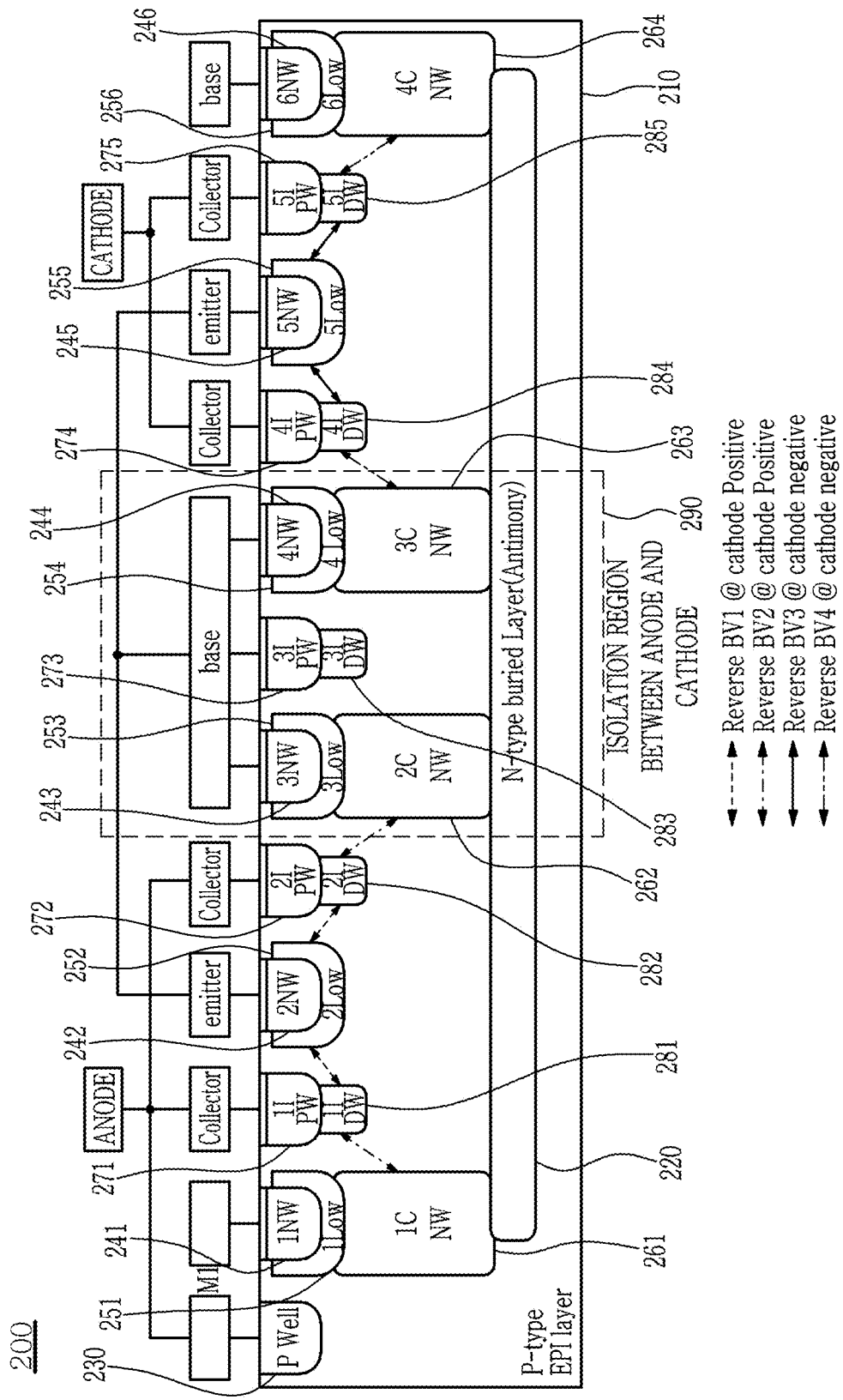
FIGS. 4 and 5 are diagrams illustrating a bidirectional ESD protection device according to a second exemplary embodiment of the present disclosure.
Figure 5:
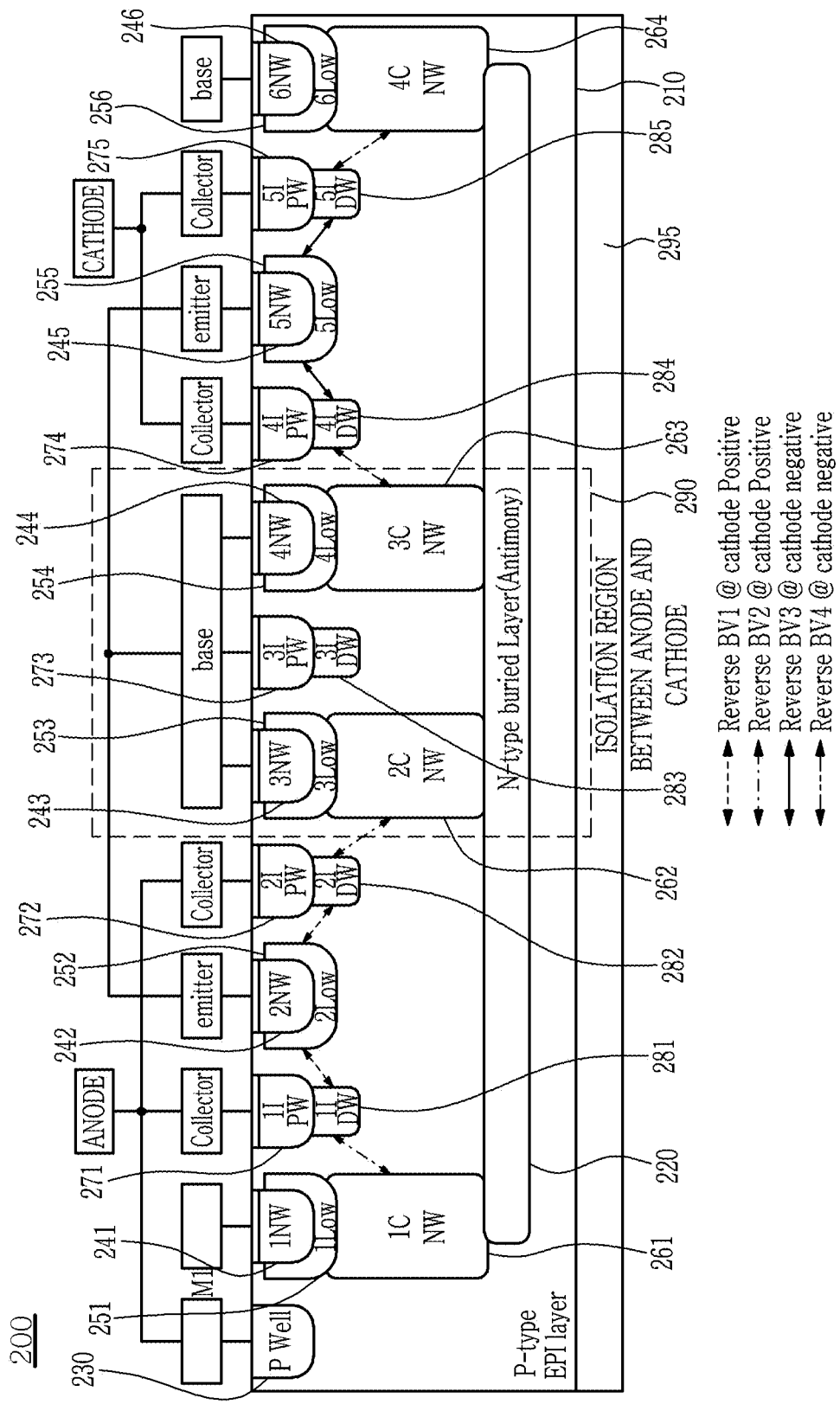

FIGS. 4 and 5 are diagrams illustrating a bidirectional ESD protection device according to a second exemplary embodiment of the present disclosure.

Referring to FIGS. 4 and 5, the bidirectional ESD protection device 200 according to the second exemplary embodiment of the present disclosure includes an epitaxial layer 210, a buried layer 220, a P well 230, a first N well 241, a second N well 242, a third N well 243, a fourth N well 244, a fifth N well 245, a sixth N well 246, a first doped layer 251, a second doped layer 252, a third doped layer 253, a fourth doped layer 254, a fifth doped layer 255, a sixth doped layer 256, a first connection N well 261, a second connection N well 262, a third connection N well 263, a fourth connection N well 264, a first isolation P well 271, a second isolation P well 272, a third isolation P well 273, a fourth isolation P well 274, a fifth isolation P well 275, a first isolation deep well 281, a second isolation deep well 282, a third isolation deep well 283, a fourth isolation deep well 284, and a fifth isolation deep well 285.

The epitaxial layer 210 is on one surface of a semiconductor substrate 295. The epitaxial layer 210 has a P-type conductivity, and may comprise elemental silicon and be formed by an epitaxial growth process. For example, the epitaxial layer 210 may further comprise one or more dopants and be doped by adding the dopant(s) during the epitaxial growth process. The epitaxial layer may also be doped by ion implantation after the epitaxial layer is formed.

The buried layer 220 is in the epitaxial layer 210 and has a predetermined width. The buried layer 220 may be close to a lower surface of the epitaxial layer 210, inside the epitaxial layer 210. The buried layer 220 is connected to lower surfaces of the first connection N well 261 to the fourth connection N well 264. The buried layer 220 comprises antimony, a material of the second conductivity type, for example.

The P well 230 is in the epitaxial layer 210, and at or adjacent to an upper surface of the epitaxial layer 210. The P well 230 may be at one outermost side or border of the device 200 (e.g., close to the left or right side of the epitaxial layer 210 in the drawing). The P well 230 may be formed by injecting high-concentration first-conductivity-type impurities into the surface of the epitaxial layer 210 through a photolithographically-patterned mask. The P well 230 is connected (e.g., in ohmic contact with) to a P-sub terminal and/or electrode.

The first N well 241 to the sixth N well 246 are in the epitaxial layer 210, and at or adjacent to the upper surface of the epitaxial layer 210. The first N well 241 to the sixth N well 246 are between the right side of the epitaxial layer 210 and the P well 230 in the drawing, and spaced apart from each other by a predetermined distance.

The first N well 241 is at or adjacent to the P well 230 and connected to an M1 terminal and/or electrode. The second N well 242 is at or adjacent to the first N well 241 and connected to an emitter terminal and/or electrode. That is, a P+ region adjacent to the second N well 242 may be connected to the anode collector terminal and/or electrode, and the second N well 242 is connected to the anode emitter terminal and/or electrode.

The third N well 243 is adjacent to the second N well 242 and connected to a base terminal and/or electrode.

The fourth N well 244 is adjacent to the third N well 243 and connected to the base terminal and/or electrode.

The fifth N well 245 is adjacent to the fourth N well 244 and connected to an emitter terminal and/or electrode. That is, a P+ region adjacent to the fifth N well 245 is connected to the cathode collector terminal and/or electrode, and the fifth N well 245 is connected to the cathode emitter terminal and/or electrode.

The sixth N well 246 is adjacent to the fifth N well 245 and connected to a base terminal and/or electrode. Thus, the second N well 242 is between the first N well 241 and the third N well 243, the third N well 243 is between the second N well 242 and the fourth N well 244, the fourth N well 244 is between the third N well 243 and the fifth N well 245, and the fifth N well 245 is between the fourth N well 244 and the sixth N well 246.

The first doped layer 251 to the sixth doped layer 256 are in the epitaxial layer 210, and under the first N well 241 to the sixth N well 246.

The first doped layer 251 to the sixth doped layer 256 may overlap with parts of the first N well 241 to the sixth N well 246, respectively. That is, the first doped layer 251 is under the first N well 241, and may overlap with the first N well 241. The second doped layer 252 is under the second N well 242, and may overlap with the second N well 242. The third doped layer 253 is under the third N well 243, and may overlap with the third N well 243. The fourth doped layer 254 is under the fourth N well 244, and may overlap with the fourth N well 244. The fifth doped layer 255 is under the fifth N well 245, and may overlap with the fifth N well 245. The sixth doped layer 256 is under the sixth N well 246, and may overlap with the sixth N well 246.

The first connection N well 261 to the fourth connection N well 264 are in the epitaxial layer 210. The first connection N well 261 to the fourth connection N well 264 may connect the buried layer 220 to the first doped layer 251, the third doped layer 253, the fourth doped layer 254, and the sixth doped layer 256 or lower surfaces thereof, respectively. That is, in the drawing, an upper portion of the first connection N well 261 is connected to the first doped layer 251, and a lower portion of the first connection N well 261 is connected to the buried layer 220. In the drawing, an upper portion of the second connection N well 262 is connected to the third doped layer 253, and a lower portion of the second connection N well 262 is connected to the buried layer 220. In the drawing, an upper portion of the third connection N well 263 is connected to the fourth doped layer 254, and a lower portion of the third connection N well 263 is connected to the buried layer 220. In the drawing, an upper portion of the fourth connection N well 264 is connected to the sixth doped layer 256, and a lower portion of the fourth connection N well 264 is connected to the buried layer 220.

The first isolation P well 271 to the fifth isolation P well 275 are in the epitaxial layer 210, and at or adjacent to the upper surface of the epitaxial layer 210. The first isolation P well 271 to the fifth isolation P well 275 are spaced apart from each other by a predetermined distance, and are respectively between adjacent ones of the N wells.

The first isolation P well 271 is between the first N well 241 and the second N well 242 and connected to a first (e.g., anode) collector terminal and/or electrode. The second isolation P well 272 is between the second N well 242 and the third N well 243 and connected to the first collector terminal and/or electrode. The third isolation P well 273 is between the third N well 243 and the fourth N well 244 and connected to the base terminal and/or electrode. The fourth isolation P well 274 is between the fourth N well 244 and the fifth N well 245 and connected to a second (e.g., cathode) collector terminal and/or electrode. The fifth isolation P well 275 is between the fifth N well 245 and the sixth N well 246 and connected to the second collector terminal and/or electrode.

The first isolation deep well 281 to the fifth isolation deep well 285 are in the epitaxial layer 210, and under the first isolation P well 271 to the fifth isolation P well 275, respectively. The first isolation deep well 281 is under the first isolation P well 271, and connected to a lower portion of the first isolation P well 271. The second isolation deep well 282 is under the second isolation P well 272, and connected to a lower portion of the second isolation P well 272. The third isolation deep well 283 is under the third isolation P well 273, and connected to a lower portion of the third isolation P well 273. The fourth isolation deep well 284 is under the fourth isolation P well 274, and connected to a lower portion of the fourth isolation P well 274. The fifth isolation deep well 285 is under the fifth isolation P well 275, and connected to a lower portion of the fifth isolation P well 275.

The third N well 243, the third isolation P well 273, and the fourth N well 244 connected to the base terminal and/or electrode in the center of the drawing constitute an isolation region 290. Herein, the isolation region 290 serves as a region for isolation between an anode on the left side of the drawing and a cathode on the right side of the drawing. The isolation region 290 includes the third doped layer 253 and the second connection N well 262 connected to the third N well 243, the third isolation deep well 283 connected to the third isolation P well 273, the fourth doped layer 254 and the third connection N well 263 connected to the fourth N well 244, and part of the buried layer 220.

Herein, the P-sub terminal and/or electrode and the collector terminals and/or electrodes on the left side of the drawing constitute the anode, and the collector terminals and/or electrodes on the right side of the drawing constitute the cathode. The device 200 may function as a type or kind of bidirectional diode, in which only voltages greater than a first positive threshold and voltages less than a second negative threshold pass through the device.

The P well 230, the first isolation P well 271, the first isolation deep well 281, the second isolation P well 272, and the second isolation deep well 282 constitute an anode region. Herein, the anode region may include the first N well 241, the first doped layer 251, the first connection N well 261, the second N well 242, and the second doped layer 252.

The fourth isolation P well 274, the fourth isolation deep well 284, the fifth isolation P well 275, and the fifth isolation deep well 285 constitute a cathode region. Herein, the cathode region may include the fifth N well 245, the fifth doped layer 255, the sixth N well 246, the sixth doped layer 256, and the fourth connection N well 264.

The isolation region 290 constitutes an isolation structure having a very large BVcex between the anode region and the cathode region. That is, the BVcex of the isolation region 290 has a value greater than the breakdown voltages (BV2 @ cathode positive and BV1 @ cathode positive) when the cathode is subjected to positive zapping. Herein, the breakdown voltage BV2 @ cathode positive has a value greater than the breakdown voltage BV1 @ cathode positive, and has the relation below:

$$BVcex > BV2@\text{cathode positive} >> BV1@\text{cathode positive}$$

In addition, the BVcex of the isolation region 290 has a value greater than breakdown voltages (BV3 @ cathode negative and BV4 @ cathode negative) when the cathode is subjected to negative zapping. Herein, the breakdown voltage BV4 @ cathode negative has a value greater than the breakdown voltage BV3 @ cathode negative, and has the relation below:

$$BVcex > BV4@\text{cathode negative} >> BV3@\text{cathode negative}$$

In addition, the isolation P well 230 and the base (that is, a PNP device) in the anode region or the cathode region may comprise a multi-finger device or have a multi-finger layout.

Accordingly, the bidirectional ESD protection device 200 according to the second exemplary embodiment of the present disclosure can secure the same breakdown voltages (BVs) in positive zapping and negative zapping when the PNP transistors in the anode region and the cathode region are the same.

Figure 6:
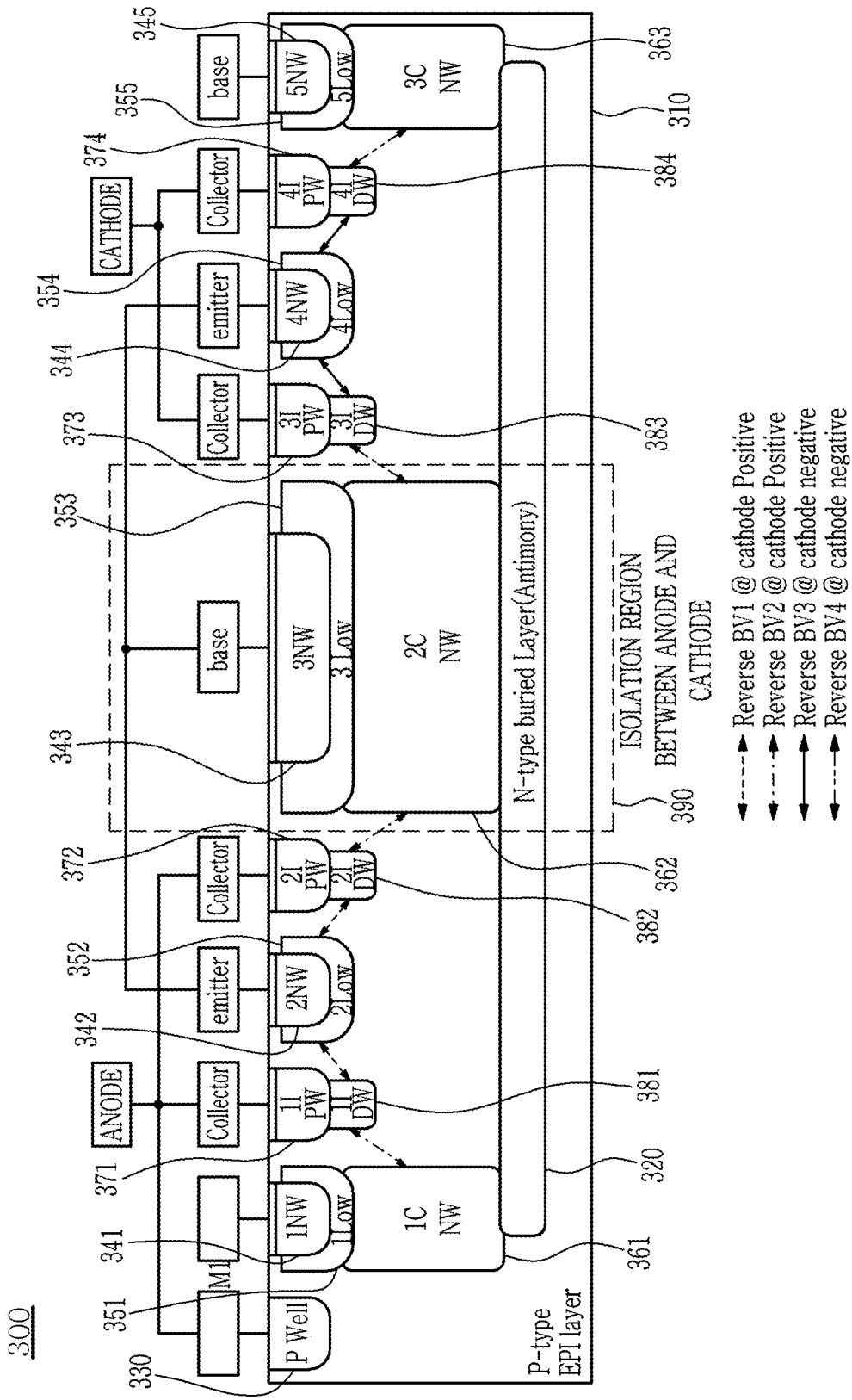
FIGS. 6 and 7 are diagrams illustrating a bidirectional ESD protection device according to a third exemplary embodiment of the present disclosure.
Figure 7:
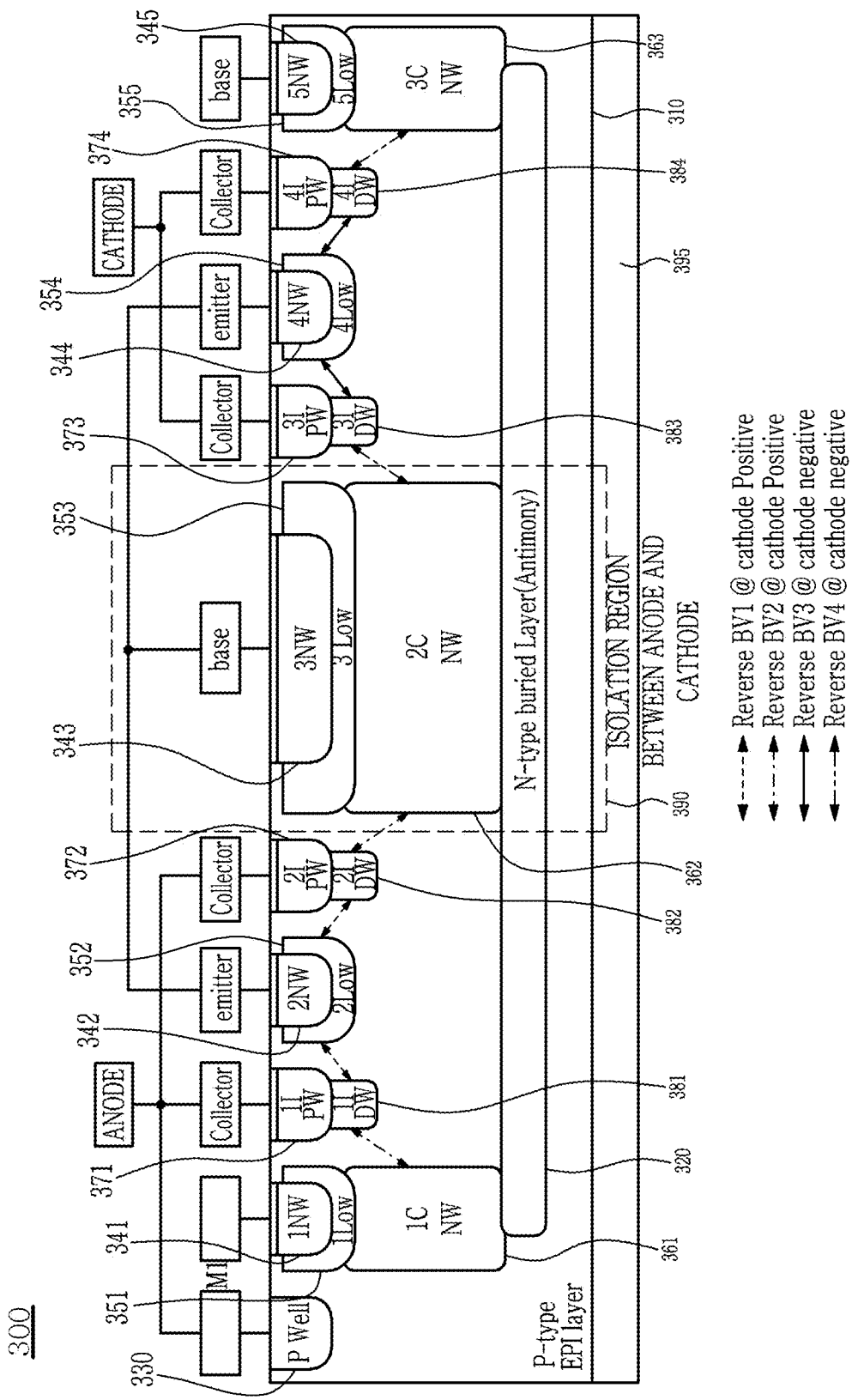

FIGS. 6 and 7 are diagrams illustrating a bidirectional ESD protection device according to a third exemplary embodiment of the present disclosure.

Referring to FIGS. 6 and 7, the bidirectional ESD protection device 300 according to the third exemplary embodiment of the present disclosure includes an epitaxial layer 310, a buried layer 320, a P well 330, a first N well 341, a second N well 342, a third N well 343, a fourth N well 344, a fifth N well 345, a first doped layer 351, a second doped layer 352, a third doped layer 353, a fourth doped layer 354, a fifth doped layer 355, a first connection N well 361, a second connection N well 362, a third connection N well 363, a first isolation P well 371, a second isolation P well 372, a third isolation P well 373, a fourth isolation P well 374, a first isolation deep well 381, a second isolation deep well 382, a third isolation deep well 383, and a fourth isolation deep well 384.

The epitaxial layer 310 is on one surface of a semiconductor substrate 395. The epitaxial layer 310 has the first conductivity type, and may comprise elemental silicon and be formed by an epitaxial growth process. For example, the epitaxial layer 310 may further comprise one or more dopants and be doped by adding the dopant(s) during the epitaxial growth process. The epitaxial layer may also be doped by ion implantation after the epitaxial layer is formed.

The buried layer 320 is in the epitaxial layer 310 and having a predetermined width. The buried layer 320 is close to a lower surface of the epitaxial layer 310, inside the epitaxial layer 310. The buried layer 320 is connected to lower surfaces of the first connection N well 361 to the fourth connection N well 364. The buried layer 320 comprises antimony, a material of the second conductivity type, for example.

The P well 330 is in the epitaxial layer 310, and at or adjacent to an upper surface of the epitaxial layer 310. The P well 330 may be at one outermost side or border of the device 300 (e.g., close to the left side of the epitaxial layer 310 in the drawing). The P well 330 may be formed by injecting high-concentration first-conductivity-type impurities into the surface of the epitaxial layer 310 through a photolithographically-patterned mask. The P well 330 is connected to (e.g., in ohmic contact with) a P-sub terminal and/or electrode.

The first N well 341 to the fifth N well 345 are in the epitaxial layer 310, and at or adjacent to the upper surface of the epitaxial layer 310. The first N well 341 to the fifth N well 345 are between the right side of the epitaxial layer 310 and the P well 330 in the drawing, and spaced apart from each other by a predetermined distance. Herein, the third N well 343 in the center of the drawing has a larger area than the first N well 341, the second N well 342, the fourth N well 344, and the fifth N well 345.

The first N well 341 is adjacent to the P well 330 and connected to an M1 terminal and/or electrode.

The second N well 342 is adjacent to the first N well 341 and connected to an emitter terminal and/or electrode. That is, a P+ region adjacent to the second N well 342 is connected to the anode collector terminal and/or electrode, and the second N well 342 is connected to the anode emitter terminal and/or electrode.

The third N well 343 is adjacent to the second N well 342 and connected to a base terminal and/or electrode.

The fourth N well 344 is adjacent to the third N well 343 and connected to an emitter terminal and/or electrode. That is, a P+ region adjacent to the fourth N well 344 is connected to the cathode collector terminal and/or electrode, the fourth N well 344 is connected to the cathode emitter terminal and/or electrode.

The fifth N well 345 is at or adjacent to the fourth N well 344 and connected to a base terminal and/or electrode. Thus, the second N well 342 is between the first N well 341 and the third N well 343, the third N well 343 is between the second N well 342 and the fourth N well 344, and the fourth N well 344 is between the third N well 343 and the fifth N well 345.

The first doped layer 351 to the fifth doped layer 355 are in the epitaxial layer 310, and under the first N well 341 and the fifth N well 345, respectively.

The first doped layer 351 to the fifth doped layer 355 may overlap with parts of the first N well 341 to the fifth N well 345, respectively. That is, the first doped layer 351 is under the first N well 341, and may overlap with part of the first N well 341. The second doped layer 352 is under the second N well 342, and may overlap with part of the second N well 342. The third doped layer 353 is under the third N well 343, and may overlap with part of the third N well 343. The fourth doped layer 354 is under the fourth N well 344, and may overlap with part of the fourth N well 344. The fifth doped layer 355 is under the fifth N well 345, and may overlap with part of the fifth N well 345.

The first connection N well 361 to the third connection N well 363 are in the epitaxial layer 310. The first connection N well 361 to the third connection N well 363 connect the buried layer 320 to the first doped layer 351, the third doped layer 353, and the fifth doped layer 355 or lower surfaces thereof. That is, in the drawing, an upper portion of the first connection N well 361 is connected to the first doped layer 351, and a lower portion of the first connection N well 361 is connected to the buried layer 320. In the drawing, an upper portion of the second connection N well 362 is connected to the third doped layer 353, and a lower portion of the second connection N well 362 is connected to the buried layer 320. In the drawing, an upper portion of the third connection N well 363 is connected to the fifth doped layer 355, and a lower portion of the third connection N well 363 is connected to the buried layer 320.

The first isolation P well 371 to the fourth isolation P well 374 are in the epitaxial layer 310, and at or adjacent to the upper surface of the epitaxial layer 310. The first isolation P well 371 to the fourth isolation P well 374 are spaced apart from each other by a predetermined distance, and are respectively between adjacent ones of the N wells.

The first isolation P well 371 is between the first N well 341 and the second N well 342 and connected to a first (e.g., anode) collector terminal and/or electrode. The second isolation P well 372 is between the second N well 342 and the third N well 343 and connected to the first collector terminal and/or electrode. The third isolation P well 373 is between the third N well 343 and the fourth N well 344 and connected to a second (e.g., cathode) collector terminal and/or electrode. The fourth isolation P well 374 is between the fourth N well 344 and the fifth N well 345 and connected to the second collector terminal and/or electrode.

The first isolation deep well 381 to the fourth isolation deep well 384 are formed in the epitaxial layer 310, and under the first isolation P well 371 to the fourth isolation P well 374. The first isolation deep well 381 is under the first isolation P well 371, and connected to a lower portion of the first isolation P well 371. The second isolation deep well 382 is under the second isolation P well 372, and connected to a lower portion of the second isolation P well 372. The third isolation deep well 383 is under the third isolation P well 373, and connected to a lower portion of the third isolation P well 373. The fourth isolation deep well 384 is under the fourth isolation P well 374, and connected to a lower portion of the fourth isolation P well 374.

The third N well 343, the third doped layer 353, and the second connection N well 362 connected to the base terminal and/or electrode positioned in the center of the drawing constitute an isolation region 390. Herein, the isolation region 390 serves as a region for isolation between an anode on the left side of the drawing and a cathode on the right side of the drawing.

Herein, the P-sub terminal and/or electrode and the collector terminals and/or electrode on the left side of the drawing constitute the anode, and the collector terminals and/or electrode on the right side of the drawing constitute the cathode. The device 300 may function as a type or kind of bidirectional diode, in which only voltages greater than a first positive threshold and voltages less than a second negative threshold pass through the device.

The P well 330, the first isolation P well 371, the first isolation deep well 381, the second isolation P well 372, and the second isolation deep well 382 constitute an anode region. Herein, the anode region may include the first N well 341, the first doped layer 351, the first connection N well 361, the second N well 342, and the second doped layer 352.

The third isolation P well 373, the third isolation deep well 383, the fourth isolation P well 374, and the fourth isolation deep well 384 constitute a cathode region. Herein, the cathode region may include the fourth N well 344, the fourth doped layer 354, the fifth N well 345, the third doped layer 353, and the third connection N well 363.

The isolation region 390 constitutes an isolation structure having a very large BVcex between the anode region and the cathode region. That is, the BVcex of the isolation region 390 has a value greater than the breakdown voltages (BV2 @ cathode positive and BV1 @ cathode positive) when the cathode is subjected to positive zapping. Herein, the breakdown voltage BV2 @ cathode positive has a value greater than the breakdown voltage BV1 @ cathode positive, and has the relation below:

$$BVcex > BV2@\text{cathode positive} \gg BV1@\text{cathode positive}$$

In addition, the BVcex of the isolation region 390 has a value greater than breakdown voltages (BV3 @ cathode negative and BV4 @ cathode negative) when the cathode is subjected to negative zapping. Herein, the breakdown voltage BV4 @ cathode negative has a value greater than the breakdown voltage BV3 @ cathode negative, and has the relation below:

$$BVcex > BV4@\text{cathode negative} \gg BV3@\text{cathode negative}$$

In addition, the isolation P well 330 and the base (that is, a PNP device) in the anode region or the cathode region may comprise a multi-finger device or have a multi-finger layout.

Accordingly, the bidirectional ESD protection device 300 according to the third exemplary embodiment of the present disclosure can secure the same breakdown voltages (BVs) in positive zapping and negative zapping when the PNP transistors in the anode region and the cathode region are the same.

Figure 8:
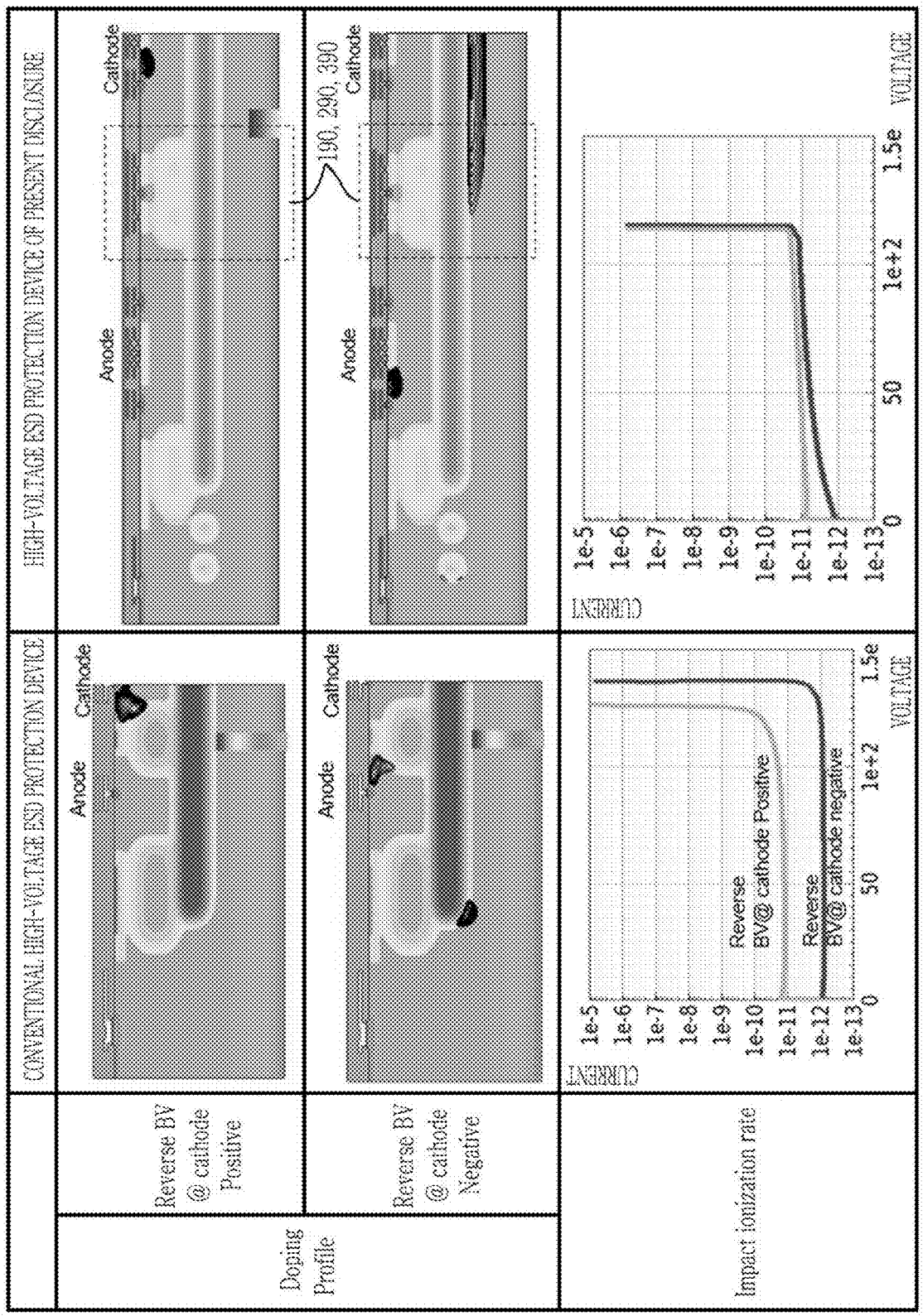
FIG. 8 is a diagram illustrating comparison between the bidirectional ESD protection devices according to the exemplary embodiments of the present disclosure and the conventional bidirectional ESD protection device.

FIG. 8 is a diagram illustrating comparisons between the bidirectional ESD protection devices according to the exemplary embodiments of the present disclosure and the conventional bidirectional ESD protection device.

Referring to FIG. 8, the conventional bidirectional ESD protection device has an anode and a cathode identical in junction design, but a large breakdown voltage (BV) mismatch occurs (see the left-hand "Impact ionization rate" graph in FIG. 8).

Conversely, when the bidirectional ESD protection devices 100, 200, and 300 according to the embodiments of the present disclosure have an anode and a cathode identical in junction design, there is almost no breakdown voltage (BV) mismatch (see the right-hand "Impact ionization rate" graph in FIG. 8), compared to the conventional bidirectional ESD protection device.

Accordingly, the bidirectional ESD protection devices 100, 200, and 300 according to the embodiments of the present disclosure realize the same PNP structures in the anode region and the cathode region, thereby preventing a breakdown voltage mismatch.

In addition, the bidirectional ESD protection devices 100, 200, and 300 according to the embodiments of the present disclosure can solve the problem in the related art, an unstable breakdown voltage, by providing a high-voltage region (e.g., of the bidirectional ESD protection devices) with a stable breakdown voltage.

Although the exemplary embodiments of the present disclosure have been described, those skilled in the art will appreciate that various modifications, additions and substitutions are possible, without departing from the scope and spirit of the disclosure as disclosed in the accompanying claims.

What is claimed is:

1. A bidirectional ESD protection device, comprising:
a P-type epitaxial layer;
an N-type buried layer in the epitaxial layer;
a P well at or adjacent to an upper surface of the epitaxial layer,
a plurality of N wells at or adjacent to the upper surface of the epitaxial layer and spaced apart from each other;
a plurality of connection N wells connected to the buried layer, in the epitaxial layer,
a plurality of isolation P wells at or adjacent to the upper surface of the epitaxial layer and respectively between adjacent ones of the plurality of N wells; and an anode region, a cathode region, and an isolation region between the anode region and the cathode region, wherein the isolation region comprises two adjacent ones of the plurality of N wells and the isolation P well between the two adjacent ones of the plurality of N wells, and the anode region and the cathode region comprise remaining ones of the plurality of N wells and remaining ones of the plurality of isolation P wells.

2. The bidirectional ESD protection device of claim 1, wherein the plurality of N wells comprise:

a first N well at or adjacent to the upper surface of the epitaxial layer and spaced apart from the P well;

a second N well at or adjacent to the upper surface of the epitaxial layer and spaced apart from the first N well;

a third N well at or adjacent to the upper surface of the epitaxial layer and spaced apart from the second N well;

a fourth N well at or adjacent to the upper surface of the epitaxial layer and spaced apart from the third N well;

a fifth N well at or adjacent to the upper surface of the epitaxial layer and spaced apart from the fourth N well; and a sixth N well at or adjacent to the upper surface of the epitaxial layer and spaced apart from the fifth N well.

3. The bidirectional ESD protection device of claim 2, further comprising a plurality of doped layers under the N wells, respectively, in the epitaxial layer, wherein the plurality of doped layers comprise:

a first doped layer at least partially surrounding the first N well, in the epitaxial layer, a second doped layer at least partially surrounding the second N well, in the epitaxial layer;

a third doped layer at least partially surrounding the third N well, in the epitaxial layer, a fourth doped layer at least partially surrounding the fourth N well, in the epitaxial layer, a fifth doped layer at least partially surrounding the fifth N well, in the epitaxial layer, and a sixth doped layer at least partially surrounding the sixth N well, in the epitaxial layer.

4. The bidirectional ESD protection device of claim 3, wherein the plurality of connection N wells comprise:

a first connection N well connecting the first doped layer with the buried layer, in the epitaxial layer;

a second connection N well connecting the second doped layer with the buried layer, in the epitaxial layer;

a third connection N well connecting the third doped layer with the buried layer, in the epitaxial layer;

a fourth connection N well connecting the fourth doped layer with the buried layer, in the epitaxial layer;

a fifth connection N well connecting the fifth doped layer with the buried layer, in the epitaxial layer; and a sixth connection N well connecting the sixth doped layer with the buried layer, in the epitaxial layer.

5. The bidirectional ESD protection device of claim 2, wherein the plurality of isolation P wells comprise:

a first isolation P well at or adjacent to the upper surface of the epitaxial layer, and between the first N well and the second N well;

a second isolation P well at or adjacent to the upper surface of the epitaxial layer, and between the second N well and the third N well;

a third isolation P well at or adjacent to the upper surface of the epitaxial layer, and between the third N well and the fourth N well;

a fourth isolation P well at or adjacent to the upper surface of the epitaxial layer, and between the fourth N well and the fifth N well; and a fifth isolation P well at or adjacent to the upper surface of the epitaxial layer, and between the fifth N well and the sixth N well.

6. The bidirectional ESD protection device of claim 5, further comprising a plurality of isolation deep wells connected to lower portions of the isolation P wells, respectively, in the epitaxial layer, wherein the plurality of isolation deep wells comprise:

a first isolation deep well connected to the first isolation P well, in the epitaxial layer;

a second isolation deep well connected to the second isolation P well, in the epitaxial layer, a third isolation deep well connected to the third isolation P well, in the epitaxial layer;

a fourth isolation deep well connected to the fourth isolation P well, in the epitaxial layer, and a fifth isolation deep well connected to the fifth isolation P well, in the epitaxial layer.

7. The bidirectional ESD protection device of claim 5, wherein the isolation region comprises the third N well, the fourth N well, and the third isolation P well, and the anode region comprises the first N well, the second N well, the first isolation P well, and the second isolation P well on one side of the isolation region, and the cathode region comprises the fifth N well, the sixth N well, the fourth isolation P well, and the fifth isolation P well on an opposite side of the isolation region.

8. A bidirectional ESD protection device, comprising:

a P-type epitaxial layer;

an N-type buried layer in the epitaxial layer;

a P well at or adjacent to an upper surface of the epitaxial layer, a plurality of N wells at or adjacent to the upper surface of the epitaxial layer and spaced apart from each other;

a plurality of connection N wells connected to the buried layer, in the epitaxial layer, and a plurality of isolation P wells at or adjacent to the upper surface of the epitaxial layer and respectively between adjacent ones of the plurality of N wells; and an anode region, a cathode region, and an isolation region between the anode region and the cathode region, wherein the isolation region comprises two adjacent ones of the plurality of N wells and the isolation P well between the two adjacent ones of the two N wells, and the anode region and the cathode region face each other with the isolation region in a center, and the anode region and the cathode region are on opposite sides of the isolation region.

9. The bidirectional ESD protection device of claim 8, wherein the plurality of N wells comprise:

a first N well at or adjacent to the upper surface of the epitaxial layer and spaced apart from the P well;

a second N well at or adjacent to the upper surface of the epitaxial layer and spaced apart from the first N well;

a third N well at or adjacent to the upper surface of the epitaxial layer and spaced apart from the second N well;

a fourth N well at or adjacent to the upper surface of the epitaxial layer and spaced apart from the third N well;

a fifth N well at or adjacent to the upper surface of the epitaxial layer and spaced apart from the fourth N well; and a sixth N well at or adjacent to the upper surface of the epitaxial layer and spaced apart from the fifth N well.

10. The bidirectional ESD protection device of claim 9, further comprising
a plurality of doped layers under the N wells, respectively, in the epitaxial layer,
wherein the plurality of doped layers comprise:
a first doped layer at least partially surrounding the first N well, in the epitaxial layer,
a second doped layer at least partially surrounding the second N well, in the epitaxial layer;
a third doped layer at least partially surrounding the third N well, in the epitaxial layer,
a fourth doped layer at least partially surrounding the fourth N well, in the epitaxial layer,
a fifth doped layer at least partially surrounding the fifth N well, in the epitaxial layer, and
a sixth doped layer at least partially surrounding the sixth N well, in the epitaxial layer.

11. The bidirectional ESD protection device of claim 10, wherein the plurality of connection N wells comprise:
a first connection N well under the first doped layer connecting the first doped layer with the buried layer, in the epitaxial layer;
a second connection N well under the third doped layer connecting the third doped layer with the buried layer, in the epitaxial layer;
a third connection N well under the fourth doped layer connecting the fourth doped layer with the buried layer, in the epitaxial layer; and
a fourth connection N well under the sixth doped layer connecting the sixth doped layer with the buried layer, in the epitaxial layer.

12. The bidirectional ESD protection device of claim 9, wherein the plurality of isolation P wells comprise:
a first isolation P well at or adjacent to the upper surface of the epitaxial layer, and between the first N well and the second N well;
a second isolation P well at or adjacent to the upper surface of the epitaxial layer, and between the second N well and the third N well;
a third isolation P well at or adjacent to the upper surface of the epitaxial layer, and between the third N well and the fourth N well;
a fourth isolation P well at or adjacent to the upper surface of the epitaxial layer, and between the fourth N well and the fifth N well; and
a fifth isolation P well at or adjacent to the upper surface of the epitaxial layer, and between the fifth N well and the sixth N well.

13. The bidirectional ESD protection device of claim 12, further comprising
a plurality of isolation deep wells connected to lower portions of the isolation P wells, respectively, in the epitaxial layer,
wherein the plurality of isolation deep wells comprises:
a first isolation deep well connected to the first isolation P well, in the epitaxial layer;
a second isolation deep well connected to the second isolation P well, in the epitaxial layer;
a third isolation deep well connected to the third isolation P well, in the epitaxial layer;
a fourth isolation deep well connected to the fourth isolation P well, in the epitaxial layer, and
a fifth isolation deep well connected to the fifth isolation P well, in the epitaxial layer.

14. The bidirectional ESD protection device of claim 12, wherein the isolation region comprises the third N well, the fourth N well, and the third isolation P well,
the anode region comprises the first N well, the second N well, the first isolation P well, and the second isolation P well,
the cathode region comprises the fifth N well, the sixth N well, the fourth isolation P well, and the fifth isolation P well,
the anode region and the cathode region are on opposite sides of the isolation region, and
the first N well, the second N well, the first isolation P well, and the second isolation P well face the fifth N well, the sixth N well, the fourth isolation P well, and the fifth isolation P well, with the isolation region in the center.

15. A bidirectional ESD protection device, comprising:
a P-type epitaxial layer;
an N-type buried layer in the epitaxial layer;
a P well at or adjacent to an upper surface of the epitaxial layer,
a plurality of N wells at or adjacent to the upper surface of the epitaxial layer and spaced apart from each other;
a plurality of connection N wells connected to the buried layer, in the epitaxial layer, and
a plurality of isolation P wells at or adjacent to the upper surface of the epitaxial layer and respectively between each of the plurality of N wells; and
an anode region, a cathode region, and an isolation region between the anode region and the cathode region,
wherein the isolation region comprises one of the plurality of N wells, and
the anode region and the cathode region comprise remaining ones of the plurality of N wells and the plurality of isolation P wells,
the remaining ones of the plurality of N wells and the plurality of isolation P wells face each other with the isolation region in a center, and the anode region and the cathode region are on opposite sides of the isolation region.

16. The bidirectional ESD protection device of claim 15, wherein the plurality of N wells comprise:
a first N well at or adjacent to the upper surface of the epitaxial layer and spaced apart from the P well;
a second N well at or adjacent to the upper surface of the epitaxial layer and spaced apart from the first N well;
a third N well at or adjacent to the upper surface of the epitaxial layer and spaced apart from the second N well;
a fourth N well at or adjacent to the upper surface of the epitaxial layer and spaced apart from the third N well; and
a fifth N well at or adjacent to the upper surface of the epitaxial layer and spaced apart from the fourth N well, and
the plurality of isolation P wells comprise:
a first isolation P well at or adjacent to the upper surface of the epitaxial layer, and between the first N well and the second N well;
a second isolation P well at or adjacent to the upper surface of the epitaxial layer, and between the second N well and the third N well;
a third isolation P well at or adjacent to the upper surface of the epitaxial layer, and between the third N well and the fourth N well; and a fourth isolation P well at or adjacent to the upper surface of the epitaxial layer, and between the fourth N well and the fifth N well.

17. The bidirectional ESD protection device of claim 16, further comprising
a plurality of doped layers comprising:
a first doped layer at least partially surrounding the first N well, in the epitaxial layer;
a second doped layer at least partially surrounding the second N well, in the epitaxial layer,
a third doped layer at least partially surrounding the third N well, in the epitaxial layer,
a fourth doped layer at least partially surrounding the fourth N well, in the epitaxial layer, and
a fifth doped layer at least partially surrounding the fifth N well, in the epitaxial layer.

18. The bidirectional ESD protection device of claim 17, wherein the plurality of connection N wells comprise:
a first connection N well connecting the first doped layer with the buried layer, in the epitaxial layer;
a second connection N well connecting the third doped layer with the buried layer, in the epitaxial layer; and
a third connection N well connecting the fifth doped layer with the buried layer, in the epitaxial layer.

19. The bidirectional ESD protection device of claim 16, further comprising
a plurality of isolation deep wells connected to lower portions of the isolation P wells, respectively, in the epitaxial layer,
wherein the plurality of isolation deep wells comprise:
a first isolation deep well connected to the first isolation P well under the first isolation P well, in the epitaxial layer,
a second isolation deep well connected to the second isolation P well under the second isolation P well, in the epitaxial layer,
a third isolation deep well connected to the third isolation P well under the third isolation P well, in the epitaxial layer, and
a fourth isolation deep well connected to the fourth isolation P well under the fourth isolation P well, in the epitaxial layer.

20. The bidirectional ESD protection device of claim 16, wherein the isolation region comprises the third N well,
the anode region comprises the first N well, the second N well, the first isolation P well, and the second isolation P well,
the cathode region comprises the fourth N well, the fifth N well, the third isolation P well, and the fourth isolation P well, and
the first N well, the second N well, the first isolation P well, and the second isolation P well face the fourth N well, the fifth N well, the third isolation P well, and the fourth isolation P well, with the isolation region in the center.

* * * * *